United States Patent
Wong et al.

[11] Patent Number: 5,428,305
[45] Date of Patent: Jun. 27, 1995

[54] DIFFERENTIAL LOGIC LEVEL TRANSLATOR CIRCUIT WITH DUAL OUTPUT LOGIC LEVELS SELECTABLE BY POWER CONNECTOR OPTIONS

[75] Inventors: Puck Wong, Huntington Beach; Lloyd F. Linder, Agora Hills; Erick M. Hirata, Gardena, all of Calif.

[73] Assignee: Hughes Aircraft Company, Los Angeles, Calif.

[21] Appl. No.: 129,939

[22] Filed: Sep. 30, 1993

Related U.S. Application Data

[63] Continuation-in-part of Ser. No. 875,471, Apr. 29, 1992, abandoned.

[51] Int. Cl.⁶ ................ H03K 19/018; H03K 19/086
[52] U.S. Cl. .................................... 326/75; 326/78; 326/18; 326/125; 326/126
[58] Field of Search ........... 307/475, 455, 443, 296.1; 326/75, 78, 18, 125–126, 530

[56] References Cited

U.S. PATENT DOCUMENTS

| | | | |
|---|---|---|---|
| 4,625,129 | 11/1986 | Ueno | 307/455 |
| 4,748,350 | 5/1988 | Emori | 307/455 |
| 4,806,796 | 2/1989 | Bushey et al. | 307/455 |
| 4,928,024 | 5/1990 | Shimotsuhama et al. | 307/455 |
| 5,045,807 | 9/1991 | Ishihara et al. | 307/455 |
| 5,059,827 | 10/1991 | Phan | 307/455 |
| 5,068,550 | 11/1991 | Barre | 307/475 |
| 5,132,573 | 7/1992 | Tsuru et al. | 307/475 |
| 5,172,011 | 12/1992 | Leuthold et al. | 307/455 |

OTHER PUBLICATIONS

Digital Integrated Electronics, by H. Taub, Mc–Graw Hill, 1977, pp. 246–249.

*Primary Examiner*—David R. Hudspeth
*Assistant Examiner*—Jon Santamauro
*Attorney, Agent, or Firm*—Hugh P. Gortler; Michael W. Sales; Wanda K. Denson-Low

[57] ABSTRACT

Switching between two logic circuits that produce outputs at different respective logic levels is accomplished by means of a common input differential switch that has a branch in each logic circuit. A common current source supplies current to the branches within each logic circuit. The current source remains on regardless of which logic level is selected, thereby enhancing switching speed. The logic circuits produce logic outputs at a common output differential switch, which in turn provides a selected output to a single output terminal. The logic circuits are configured so that the output from the circuit corresponding to the selected logic level dominates the output from the other logic circuit at the output differential switch.

5 Claims, 3 Drawing Sheets

5,428,305

DIFFERENTIAL LOGIC LEVEL TRANSLATOR CIRCUIT WITH DUAL OUTPUT LOGIC LEVELS SELECTABLE BY POWER CONNECTOR OPTIONS

RELATED APPLICATION

This application is a continuation-in-part of Ser. No. 07/875,471, filed Apr. 29, 1992 now abandoned.

BACKGROUND OF THE INVENTION

1. Field of the Invention

The present invention generally relates to the field of microelectronic integrated circuits, and more specifically to a logic level translator circuit capable of translating a differential input signal into either an emitter-coupled logic (ECL) or transistor-transistor logic (TTL) output signal by selection of power connector options for the circuit.

2. Description of the Related Art

It is often required in the implementation of microelectronic integrated circuitry to translate a differential input signal at a first logic level, such as low-level differential logic (LLDL) or differential ECL, to a different logic level such as single-ended ECL or single-ended TTL. Circuits for performing such translation are known in the art, such as described in a textbook entitled "DIGITAL INTEGRATED ELECTRONICS" by H Taub, Mc-Graw Hill, 1977, pp. 246-249.

However, known level translation circuits can only perform one type of translation. For example, a translator circuit for translating LLDL to ECL is not capable of translating LLDL to TTL.

SUMMARY OF THE INVENTION

In a logic level translator circuit embodying the present invention, a low-level differential logic (LLDL) or differential emitter-coupled logic (ECL) input signal is applied to first and second differential switches which produce first and second logic switching signals respectively in response thereto.

An output differential switch selectably produces an output signal at ECL level or transistor-transistor logic (TTL) level in response to the first or second switching signal respectively.

Power supply bond pad options or connections to the circuit and thereby the biasing of the first and second differential switches are changeable such that one of the switches is activated and the other is de-activated to select the desired output signal logic level.

The present translator circuit provides flexibility in that it can be configured for one of two standard formats, and can be used in very large scale integration (VLSI) applications in which the functionality of the circuit is determined by the connector options. It can be used in high-speed digital circuits as a standard cell. The present architecture is advantageous in that only one input-output (I/O) translator cell or circuit is needed for digital system designs, instead of using several different circuits in order to translate an input logic level to different output logic levels.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
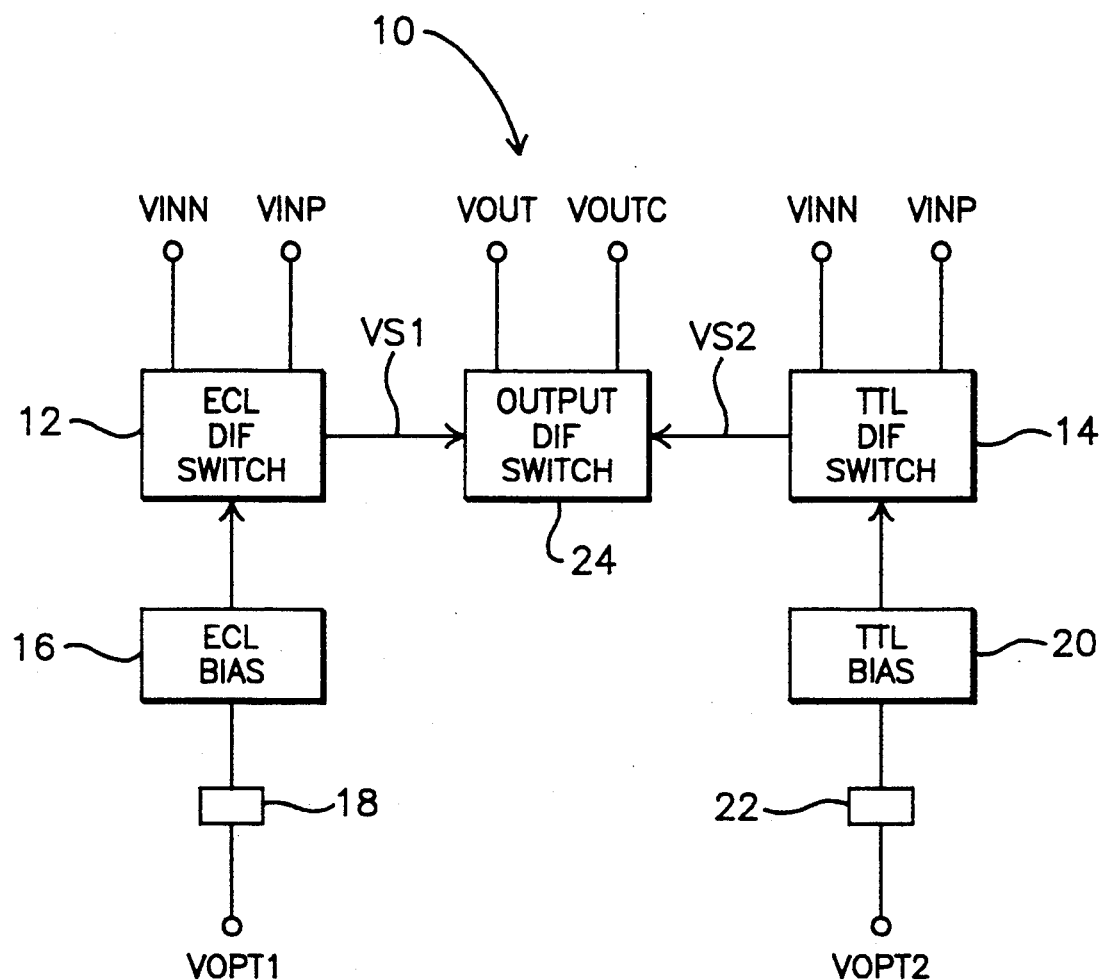
FIG. 1 is a block diagram of a differential logic level translator circuit embodying the present invention.

As illustrated in FIG. 1, a differential logic level translator circuit embodying the present invention is designated as 10, and includes an emitter-coupled logic (ECL) differential switch 12 and a transistor-transistor logic (TTL) differential switch 14. A differential input signal VINN,VINP is applied to the switches 12 and 14. The input signal VINN,VINP can be at low-level differential logic (LLDL) level with one of VINN and VINP at $-2.05$ V and the other at $-2.3$ V. Alternatively, the input signal VINN,VINP can be at differential ECL logic level with one of VINN and VINP at $-1.6$ V and the other at $-0.8$ V.

The circuit 10 further includes an ECL bias circuit 16 which activates the ECL switch 12 when a bonding pad or connector 18 is connected to receive a power supply voltage VOPT1. A bias circuit 20 similarly activates the TTL switch 14 when a bonding pad or connector 22 is connected to receive a power supply voltage VOPT2. The bias circuit 16 is de-activated by open-circuiting the connector 18. The bias circuit 20 is de-activated by grounding the connector 22.

When the ECL switch 12 is activated and the TTL switch 14 is de-activated, the ECL switch 12 generates and applies a differential switching signal VS1 corresponding to the logical sense of the input signal VINN,VINP to an output differential switch 24. The bias circuit 16 is configured such that the output switch 24 generates an output signal VOUT at ECL logic level corresponding to the logical sense of the switching signal VS1 and thereby the input signal VINN,VINP. The TTL switch 14, which is de-activated, does not affect the output signal VOUT.

The output ECL levels are $-0.8$ V and $-1.6$ V for the opposite logical senses respectively. When a differential ECL output is required, the output switch 24 is further configured to produce a complementary differential ECL output signal VOUTC having a logical sense opposite to the signal VOUT.

When the TTL switch 14 is activated and the ECL switch 12 is de-activated, the TTL switch 14 generates and applies a differential switching signal VS2 corresponding to the logical sense of the input signal VINN,VINP to the switch 24. The bias circuit 20 is configured such that the output switch 24 generates the output signal VOUT at TTL logic level corresponding to the logical sense of the switching signal VS2 and thereby the input signal VINN,VINP. The ECL switch 12, which is de-activated, does not affect the output signal VOUT. The output TTL levels are 0 V and 3.6 V for the opposite logical senses respectively.

The circuit 10 is capable of selectably translating a differential input signal at LLDL or differential ECL level to either a single-ended ECL, differential ECL or TTL output signal by selecting the power supply bond pad or connector options. This enables the single circuit 10 to be used in applications in which different types of translators were required in the prior art.

Figure 2:
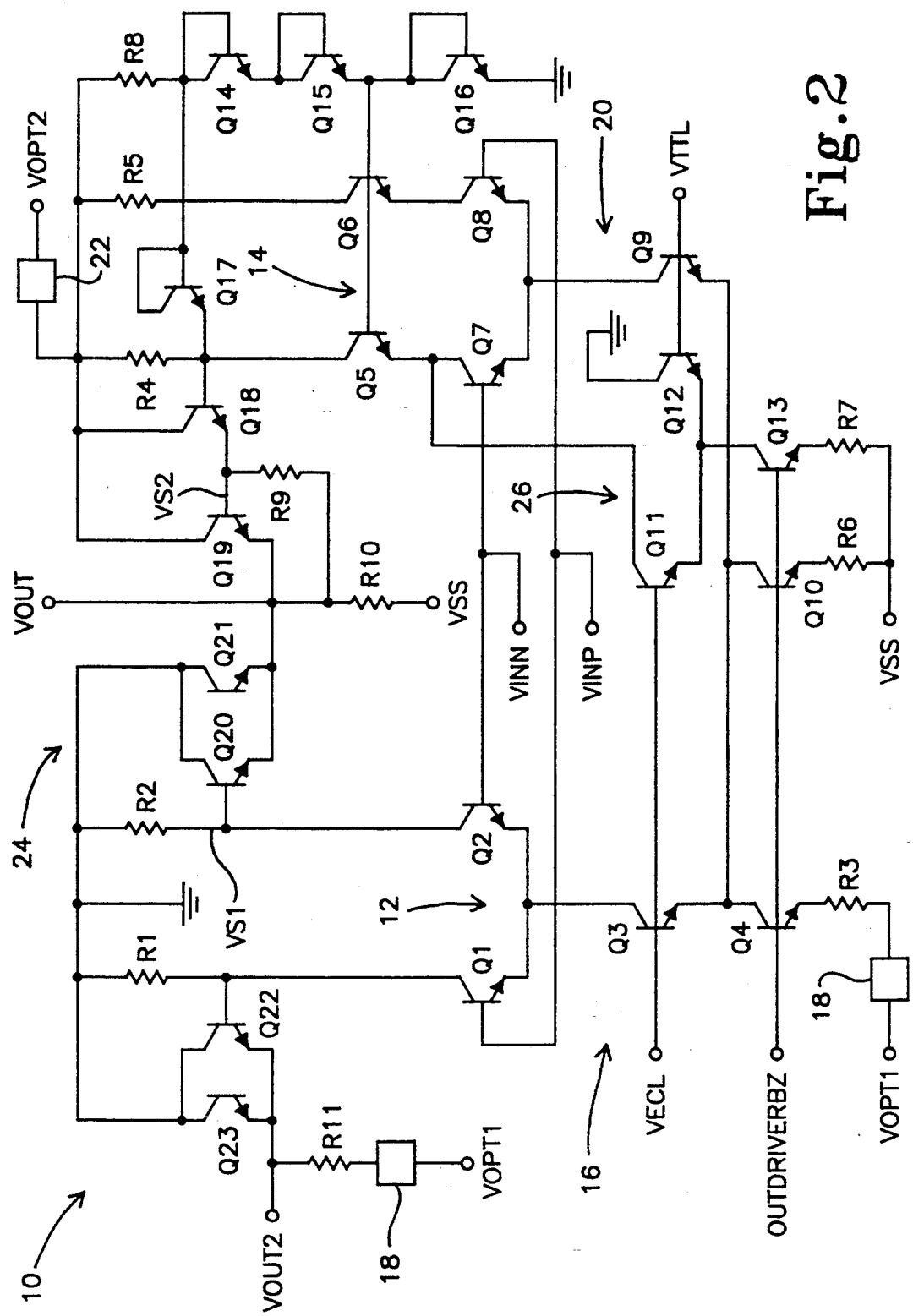
FIG. 2 is a schematic diagram of one embodiment of the present translator circuit.

A detailed exemplary embodiment of the translator circuit 10 is illustrated in FIG. 2, and includes a plurality of NPN bipolar transistors as will be described below. The ECL switch 12 includes transistors Q1 and Q2 having bases connected to receive the differential inputs VINP and VINN respectively. The collectors of the transistors Q1 and Q2 are connected to ground through load resistors R1 and R2 respectively.

The bias circuit 16 includes a switching transistor Q3 having a collector connected to the emitters of the transistors Q1 and Q2. The base of the transistor Q3 is connected to receive an ECL selection signal VECL, and the emitter of the transistor Q3 is connected to the collector of a current source transistor Q4. The emitter of the transistor Q4 is connected through a resistor R3 to the connector 18. A bias voltage OUTDRIVERBZ is applied to the base of the transistor Q4.

The TTL switch 14 includes transistors Q5 and Q6 having collectors connected to the connector 22 through load resistors R4 and R5 respectively. The emitters of the transistors Q5 and Q6 are connected to the collectors of transistors Q7 and Q8.

The bias circuit 20 includes a switching transistor Q9. The emitters of the transistors Q7 and Q8 are both connected to the collector of the transistor Q9. The emitter of the transistor Q9 is connected to the collector of the transistor Q4, and the base of the transistor Q9 is connected to receive a TTL selection signal VTTL. The emitter of the transistor Q9 is also connected to the collector of a current source transistor Q10. The emitter of the transistor Q10 is connected to a voltage source VSS through a resistor R6, and the base of the transistor Q10 is connected to receive the bias voltage OUT-DRIVERBZ.

A clamp circuit 26 includes transistors Q11 and Q12 having collectors connected to the emitter of the transistor Q5 and ground respectively. The emitters of the transistors Q11 and Q12 are both connected to the collector of a current source transistor Q13, the emitter of which is connected to the voltage source VSS through a resistor R7. The base of the transistor Q11 is connected to receive the ECL selection signal VECL, the base of the transistor Q12 is connected to receive the TTL selection signal VTTL and the base of the transistor Q13 is connected to receive the bias voltage OUT-DRIVERBZ.

The bias circuit 20 also includes transistors Q14, Q15 and Q16 which are connected in series with a resistor R8 between the connector 22 and ground. The transistors Q14, Q15 and Q16 have their bases and collectors connected together and function electrically as diodes. The bias circuit 20 also includes a transistor Q17, the base and collector of which are connected to the junction of the transistor Q14 and resistor R8. The emitter of the transistor Q17 is connected to the collector of the transistor Q5 and also to the base of a transistor Q18. The collector of the transistor Q18 is connected to the connector 22, and the emitter of the transistor Q18 is connected to one end of a resistor R9.

The output switch 24 includes a transistor Q19 having a collector connected to the connector 22 and a base connected to the emitter of the transistor Q18. The emitter of the transistor Q19 is connected through a resistor R10 to the voltage source VSS and also to the other end of the resistor R9. The output switch 24 further includes parallel-connected transistors Q20 and Q21 having collectors connected to ground, emitters connected to the emitter of the transistor Q19 and bases connected to the collector of the transistor Q2. The two transistors Q20,Q21 connected in parallel provide high output current for ECL operation, but function as and can be replaced by a single transistor if desired.

The switching signal VS1 is applied from the ECL switch 12 to the bases of the transistors Q20 and Q21. The switching signal VS2 is applied from the TTL switch 14 to the base of the transistor Q19. The output signal VOUT is produced at the emitters of the transistors Q19, Q20 and Q21.

Where a differential ECL output is required, the output switch 24 further includes parallel-connected transistors Q22 and Q23 having collectors connected to ground, emitters connected through a resistor R11 to the connector 18 and bases connected to the collector of the transistor Q1. The complementary ECL output voltage VOUT2 is produced at the emitters of the transistors Q22 and Q23. The transistors Q1,Q2, Q7,Q8, Q11,Q12 and Q19,(Q20,Q21) constitute differential pairs respectively.

The voltages applied to the circuit 10 are as follows: VOPT1=−5.2 V for ECL, open for TTL; VOPT2=5.2 V for TTL, ground for ECL; VECL=−3.0 V for ECL, −3.3 V for TTL; VTTL=−3 V for TTL, −3.3 V for ECL; VSS=−5.2 V; OUTDRIVERBZ=−3.85 V.

The bias voltage OUTDRIVERBZ and the values of the resistors R1 to R7 are selected such that constant currents flow through the current source transistors Q4, Q10 and Q13 as follows: Q4 current=12 ma; Q10 current=1 ma; Q13 current=0.1 ma.

The values of the resistors are as follows: R1=70Ω; R2=70Ω; R3=40Ω; R4=5KΩ; R5=5KΩ; R6=500Ω; R7=5KΩ; R8=5.2KΩ; R9=600Ω; R10=1KΩ; R11=1KΩ.

For selecting the ECL output logic level, the voltage VOPT1=−5.2 V is applied to the connector 18, VECL=−3.0 V is applied to the base of the transistor Q3, VOPT2=ground is applied to the connector 22 and VTTL=−3.3 V is applied to the base of the transistor Q9. The transistors Q3, Q4 and Q10 are turned on, and 12 ma from the source transistor Q4 plus 1 ma from the source transistor Q10 are caused to flow through the transistor Q3 and ECL switch 12.

When VINP is high (−2.05 V for LLDL or −0.8 V for differential ECL) and VINN is low (−2.3 V for LLDL or −1.6 V) for differential ECL, due to differential action, the transistor Q1 is turned on and the transistor Q2 is turned off. The bases of the transistors Q20 and Q21, and thereby the switching signal VS1, are at ground or zero potential. The voltage at the emitters of the transistors Q20 and Q21, which constitutes the output voltage VOUT, is one diode drop more negative than the base voltage, or −0.8 V. The current flow through the resistor R10 is (5.2 V−0.8 V)/1KΩ=4.4 ma.

The voltage at the bases of the transistors Q22 and Q23 is equal to the current supplied from the transistors Q4 (12 ma)+Q10 (1 ma)=13 ma multiplied by the value of the resistor R1 (70Ω), or −0.9 V. The voltage at the emitters of the transistors Q22 and Q23, which constitutes the complementary output voltage VOUT2, is one diode drop more negative than the base voltage, or −1.7 V. The current flow through the resistor R11 is (5.2 V−1.7 V)/1KΩ=3.5 ma.

The operation in ECL mode when the logical sense of the differential input signal is reversed (VINP is low and VINN is high) is symmetrical to the operation described. Due to differential action, the transistor Q1 is turned off, the transistor Q2 is turned on, VS1=−0.9 V, VOUT=−1.7 V and VOUT2=−0.8 V.

In ECL mode, the transistor Q9 is turned off and prevents current from flowing through the transistors Q6, Q7 and Q8 of the TTL switch 14. Due to differential action, the transistor Q12 is turned off, whereas the transistor Q11 is turned on. Current flows through the transistors Q5, Q11 and Q13 and resistor R4 causing 0.1 ma×5KΩ=0.5 V to be dropped across the resistor R4. This voltage is applied to the base of the transistor Q18, such that the voltage at the emitter of the transistor Q18 is one diode drop more negative than the base voltage, or −1.3 V. The emitter voltage of the transistor Q18 clamps the base of the transistor Q19 at −1.3 V. Due to differential action, the transistor Q19 is turned off and does not affect the outpost voltage VOUT.

For selecting the TTL output logic level, the voltage VOPT2=5.2 V is applied to the connector 22, VTTL=−3 V is applied to the base of the transistor Q9, the connector 18 is open-circuited (unconnected) and VECL=−3.3 V is applied to the base of the transistor Q3. The transistors Q9 and Q10 are turned on, and 1 ma from the source transistor Q10 is caused to flow through the transistor Q9 and TTL switch 14. Due to differential action, the transistor Q11 is turned off whereas the transistor Q12 is turned on, such that the current from the transistor Q13 flows through the transistor Q12 to ground and does not affect the operation of the switch 14.

The transistors Q14, Q15, Q16 and Q17 constitute a bias voltage circuit. The voltage at the junction of the transistors Q15 and Q16 and thereby at the bases of the transistors Q5 and Q6 is one diode drop above ground, or 0.8 V. The transistors Q5 and Q6 are provided to protect the transistors Q7 and Q8 respectively from breakdown. The 0.8 V applied to the bases of the transistors Q5 and Q6 limits the current therethrough to a safe value. The voltage at the junction of the transistor Q14 and resistor R8, which is applied to the transistor Q17, is three diode drops above ground, or 0.8×3=2.4 V.

When VINP is high (−2.05 V for LLDL or −0.8 V for differential ECL) and VINN is low (−2.3 V for LLDL or −1.6 V) for differential ECL, due to differential action, the transistor Q8 is turned on and the transistor Q7 is turned off. The current (1 ma) from the source transistor Q10 flows through the transistors Q6, Q8, Q9 and R5 and does not affect the output voltage VOUT.

Since the transistor Q7 is turned off, no current flows through the transistor Q5. The base of the transistor Q18 thereby floats up to the voltage at the connector 22, or 5.2 V. The voltage at the emitter of the transistor Q18 is one diode drop below the base voltage, or 4.4 V. This voltage is applied to the base of the transistor Q19 as the switching signal VS2 such that the voltage at the emitter of the transistor Q19 is one diode drop below the base voltage, or 3.6 V. This voltage constitutes the output voltage VOUT. The current through the resistor R10 is (5.2 V+3.6 V)/1KΩ=8.8 ma.

When the differential input signal is reversed (VINP is low and VINN is high), due to differential action, the transistor Q7 is turned on and the transistor Q8 is turned off. Current flowing through the resistor R4 creates a voltage drop thereacross which attempts to reach 1 ma×5KΩ=5 V. If the transistor Q17 were not provided, the voltage at the base of the transistor Q18 would drop to 5.2 V−5 V=0.2 V.

However, since the voltage at the base and collector of the diode-connected transistor Q17 is 2.4 V, the transistor Q17 becomes forward biased when the voltage at the emitter thereof drops to one diode drop below 2.4 V, or 1.6 V. This clamps the voltage at the base of the transistor Q18 at 1.6 V, such that the voltage at the emitter of the transistor Q18, which constitutes the switching voltage VS2, is one diode drop below the base voltage, or 0.8 V. The emitter of the transistor Q18 is connected to the base of the transistor Q19, such that the voltage at the emitter of the transistor Q19 is one diode drop below the base voltage, or 0 V. The output voltage VOUT is therefore 0 V, and the current flow through the resistor R10 is 5.2 V/1KΩ=5.2 ma.

In TTL mode, the connector 18 is open circuited such that the transistors Q1, Q2, Q3 and Q4 are turned off. The voltage at the bases of the transistors Q20, Q21, Q22 and Q23 is ground. Due to differential action, the transistors Q20, Q21, Q22 and Q23 are turned off and do not affect the output voltage VOUT.

Figure 3:
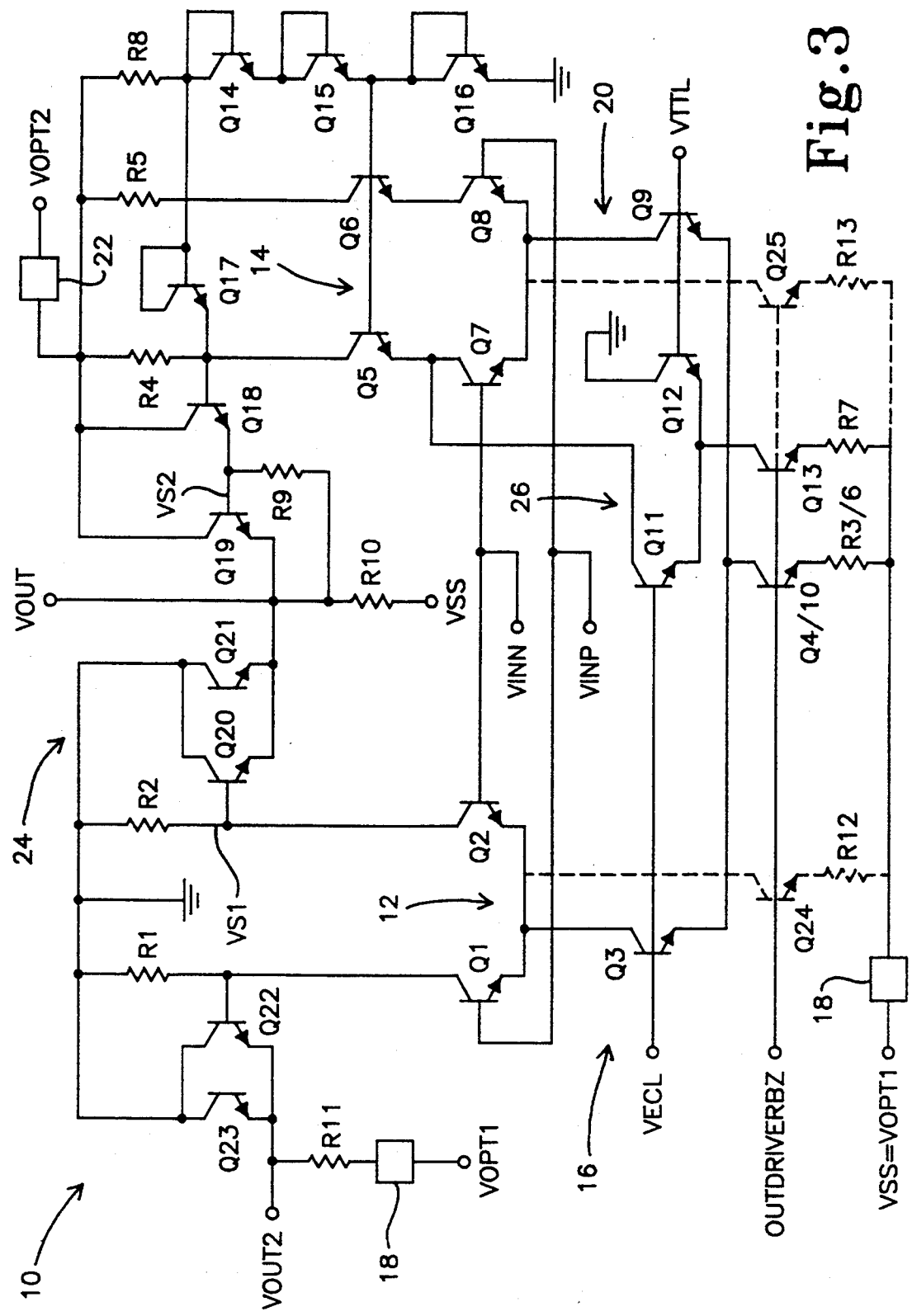
FIG. 3 is a schematic diagram of a preferred embodiment of the translator circuit.

An improved circuit that allows for a very rapid switching between output logic levels (illustrated as ECL and TTL) is presented in FIG. 3. This feature is important for applications such as communications systems with a time multiplexing capability between a number of receivers that operate at different logic levels. Switching times on the order of a few hundred picoseconds to a nanosecond, comparable to a digital gate, are achievable with this type of circuit.

The basic differences from the circuit of FIG. 2 are that in FIG. 3 only a single current source transistor Q4/10 is used to supply current to the common input differential switch Q3/Q9 for the two logic circuits, and that this current source remains fully actuated by the bias signal OUTDRIVERBZ regardless of the state of the differential logic level input signal VECL-VTTL. The current source is designated Q4/10 because it combines the functions of transistors Q4 and Q10 in FIG. 2. Rather than switching the VOPT1 connection to the emitter of Q4 (through R3) between −5.2 V and ground for the two logic levels as in FIG. 2, the emitter of Q4/10 is connected through a resistor R3/6 (combining the functions of resistors R3 and R6 in FIG. 2) to a VOPT1 pad 18 that is maintained at the VSS=−5.2 V level at all times during the operation of the circuit.

Holding the single current source transistor Q4/10 on for both logic levels avoids delays inherent in the FIG. 2 circuit for switching Q4 on and off. A further enhancement in switching speed can be achieved by adding trickle current source transistors Q24 and Q25, also biased by OUTDRIVERBZ, to provide residual trickle currents to the transistors of the logic state differential switches 12 and 14, respectively. The trickle currents are on the order of 50–100 times less than the current supplied by Q4/10; they are just enough to keep the differential switch transistors at least partially on even when the main current supply from Q4/10 has been interrupted by Q3 or Q9 turning off. The collectors of Q24 and Q25 are connected to the emitters of Q1, Q2 and Q7, Q8, respectively, while their emitters are connected to pad 18 through respective current limiting transistors R12 and R13. Q24 and Q25 provide a marginal improvement in switching speed, and are shown in dashed lines to emphasize that they are optional and not fundamental to the circuit.

The operation of the ECL and TTL logic circuits is the same as in FIG. 2. The VS1 voltage at the base of output transistor Q20 dominates the VS2 voltage at the base of output transistor Q19 in the output differential switch 24 for an ECL differential logic level input signal, and vice versa for a TTL differential logic level input signal.

While illustrative embodiments of the invention have been shown and described, numerous variations and alternate embodiments will occur to those skilled in the art, without departing from the spirit and scope of the invention. For example, the NPN bipolar transistors can be replaced by other types of transistors or active elements. The principles of the present invention are applicable to translation between logic levels other than those specifically described. Accordingly, it is intended that the present invention not be limited solely to the specifically described illustrative embodiment. Various modifications are contemplated and can be made without departing from the spirit and scope of the invention as defined by the appended claims.

We claim:

1. A logic level translator circuit for selecting between first and second logic levels in response to a differential logic level input signal, comprising:

an output terminal, first and second logic circuits producing logic outputs for said output terminal in response to a differential logic state input signal, said first logic circuit producing an output corresponding to said first logic level and said second logic circuit producing an output corresponding to said second logic level, said first and second logic circuits each including respective branches of a common input differential switch for receiving said differential logic level input signal, wherein said first and second logic circuits each further including respective branches of a common output circuit having output transistors which are wire-ORed at the emitters and use a load resistor as a bias, said common output circuit selecting between a selected output or an unselected output from said logic circuits and applying a voltage representing the selected output to said output terminal, each of said logic circuits being configured to produce said selected output that dominates said output differential switch in response to a corresponding differential logic level input signal, and said selected output uninfluenced by the unselected output, a current source supplying current to said input differential switch for both of said first and second logic circuits, and a bias circuit that maintains said current source in an actuated state supplying current to said input differential switch regardless of the state of said differential logic level input signal, thereby facilitating a rapid switching between logic levels.

2. The logic level translator circuit of claim 1, each of said logic circuits including respective logic state differential transistor switches that are supplied with current from the input differential switch branch for said logic circuit when said differential logic level input signal corresponds to the logic level of said logic circuit, but not when said differential logic level input signal corresponds to the logic level of the other logic circuit, each of said logic circuits further comprising a trickle current source for each of said logic state differential switches that provides trickle current to disable one of said logic circuits and to maintain the transistors of said logic state differential switches at least partially on, even when said differential logic state input signal corresponds to the logic level of the other logic circuit.

3. The logic level translator circuit of claim 1, said logic circuits including respective logic state differential switches that are connected to receive a common differential logic state input signal.

4. A logic level translator circuit for selecting between first and second logic levels in response to a differential logic level input signal, comprising:

an output terminal, first and second logic circuits producing logic outputs for said output terminal in response to a differential logic state input signal, said first logic circuit producing an output corresponding to said first logic level and said second logic circuit producing an output corresponding to said second logic level, said first and second logic circuits each including respective branches of a common input differential switch for receiving said differential logic level input signal, said first and second logic circuits each further including respective branches of common output circuit having output transistors which are wire-ORed at the emitters and use a load resistor as a bias said common output circuit selecting between a selected output or an unselected output from said logic circuits and applying a voltage representing the selected output to said output terminal, each of said logic circuits being configured to produce said selected output that dominates said output differential switch in response to a corresponding differential logic level input signal, each of said logic circuits including respective logic state differential transistor switches that are supplied with current from the input differential switch branch for said logic circuit when said differential logic level input signal corresponds to the logic level of said logic circuit, but not when said differential logic level input signal corresponds to the logic level of the other logic circuit, each of said logic circuits further comprising a trickle current source for each of said logic state differential switches that provides trickle current to maintain the transistors of said logic state differential switches at least partially on even when said differential logic state input signal corresponds to the logic level of the other logic circuit, and a current source supplying current to said input differential switch.

5. The logic level translator circuit of claim 4, said logic circuits including respective logic state differential switches that are connected to receive a common differential logic state input signal.

* * * * *